United States Patent
Pranatharthiharan et al.

(10) Patent No.: US 10,347,749 B2
(45) Date of Patent: Jul. 9, 2019

(54) REDUCING BENDING IN PARALLEL STRUCTURES IN SEMICONDUCTOR FABRICATION

(71) Applicant: International Business Machines Corporation, Armonk, NY (US)

(72) Inventors: Balasubramanian S. Pranatharthiharan, Watervliet, NY (US); Pietro Montanini, Albany, NY (US); John R. Sporre, Albany, NY (US); Ruilong Xie, Schenectady, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 271 days.

(21) Appl. No.: 15/469,237

(22) Filed: Mar. 24, 2017

(65) Prior Publication Data
US 2018/0277663 A1 Sep. 27, 2018

(51) Int. Cl.
*H01L 29/66* (2006.01)
*H01L 21/762* (2006.01)

(52) U.S. Cl.
CPC .. *H01L 29/66795* (2013.01); *H01L 21/76224* (2013.01); *H01L 29/66553* (2013.01)

(58) Field of Classification Search
CPC ..................................................... H01L 29/66
See application file for complete search history.

(56) References Cited

U.S. PATENT DOCUMENTS

| | | | |
|---|---|---|---|
| 6,432,784 B1 | 8/2002 | Yu | |
| 7,064,071 B2 | 6/2006 | Schwan | |
| 7,435,683 B2 | 10/2008 | Kavalieros et al. | |
| 7,829,415 B2 | 11/2010 | Cho et al. | |
| 7,868,415 B2 | 1/2011 | Willer et al. | |
| 8,420,470 B2 | 4/2013 | Choi | |
| 2015/0194335 A1 | 7/2015 | Tsai et al. | |

FOREIGN PATENT DOCUMENTS

EP       967640 A2    12/1999

OTHER PUBLICATIONS

Choi et al, "Tall FIN formation for FINFET devices of 20nm and beyond using multi-cycles of passivation and etch processes", www.spiedigitallibrary.org, 2013.

*Primary Examiner* — Marvin Payen
(74) *Attorney, Agent, or Firm* — Garg Law Firm, PLLC; Rakesh Garg; Grant Johnson

(57) ABSTRACT

A first layer of a first material is deposited on a first structure and a second structure, a surface of the first structure being disposed substantially parallelly to a surface of the second structure in at least one direction. A selectively removable material is deposited over the first layer and removed up to a height of a first step. The first material is removed from a portion of the first layer that is exposed from removing the selectively removable material up to the height of the first step. A remainder of the selectively removable material is removed to expose a second portion of the first layer, the second portion of the first layer forming the first step. A second layer of a second material is deposited on the first structure, the second structure, and the second portion of the first layer, causing a formation of a stepped structure.

20 Claims, 13 Drawing Sheets

REDUCING BENDING IN PARALLEL STRUCTURES IN SEMICONDUCTOR FABRICATION

TECHNICAL FIELD

The present invention relates generally to a method, system, and computer program product for forming parallel structures that have a tendency to bend towards each other when fabricated. More particularly, the present invention relates to a method, system, and computer program product for reducing bending in parallel structures in semiconductor fabrication.

BACKGROUND

An integrated circuit (IC) is an electronic circuit formed using a semiconductor material, such as Silicon, as a substrate and by adding impurities to form solid-state semiconductor electronic devices (device, devices), such as transistors, diodes, capacitors, and resistors. Any reference to a "device" herein refers to a solid-state semiconductor electronic device unless expressly distinguished where used. Commonly known as a "chip" or a "package," an integrated circuit is generally encased in hard plastic, forming a "package." The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

A device generally uses several layers of different materials to implement the device properties and function. A layer of material can be conductive, semi-conductive, insulating, resistive, capacitive, or have any number of other properties. Different layers of materials have to be formed using different methods, given the nature of the material, the shape, size or placement of the material, other materials adjacent to the material, and many other considerations.

The software tools used for designing ICs produce, manipulate, or otherwise work with the circuit layout and circuit components on very small scales. Some of the components that such a tool may manipulate may only measure a few nanometers across when formed in Silicon. The designs produced and manipulated using these software tools are complex, often including hundreds of thousands of such components interconnected to form an intended electronic circuitry.

A Field Effect Transistor (FET) is a semiconductor device that controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Within the scope of the illustrative embodiments, the structures in a pair of structures are parallel to one another if at least one surface of each of the structures in the pair faces the other structure, and such surfaces are substantially parallel to one another in at least one direction. The parallel surfaces of such structures in the pair need not be exactly parallel, but may run along each other without touching each other, and separated by some distance. Within the scope of the illustrative embodiments, adjacent structures that satisfy these properties can be regarded as parallel structures unless expressly distinguished where used.

Gates of a finFET are a non-limiting example of parallel structures used to describe the various embodiments herein. These examples of parallel gates are not intended to be limiting. From this disclosure, those of ordinary skill in the art will be able to conceive many other parallelly formed structures that suffer from a similar problem of bending, and can benefit from the techniques described herein to prevent or reduce such bending, and the such other parallel structures are contemplated within the scope of the illustrative embodiments.

The illustrative embodiments recognize that forming structures that extend parallel to one another in a direction has certain inherent problems. For example, in some cases, forming such structures results in some structures being of shorter lengths than the desired length.

As another example, the proximity of the parallel structures to one another—which can be of the order of a few nanometers (nm), e.g., 4-10 nm—causes capillary action and other phenomena to exert forces on the parallel structures that cause one of the parallel structures to bend towards the other, or both parallel structures to bend towards each other. This bending causes the structures to no longer be parallel, a gap or another structure intervening the parallel structures to become tapered at the distal end of the parallel structures.

The bending of the parallel structures, the tapering of the intervening space or structure, or both, can result in undesirable electrical properties of the parallel structures, the space, the intervening structure, or some combination thereof. Therefore, the parallel structures should be fabricated in such a manner that the bending tendencies in parallel structures are discouraged, reduced, or prevented.

Therefore, a method for reducing bending in parallel structures in semiconductor fabrication would be desirable.

SUMMARY

The illustrative embodiments provide a method, system, and computer program product. An embodiment includes a method that deposits, on a first structure and a second structure, a first layer of a first material, a surface of the first structure being disposed substantially parallelly to a surface of the second structure in at least one direction. The embodiment deposits a selectively removable material over the first layer. The embodiment removes the selectively removable material up to a height of a first step from the surface of the first structure and the surface of the second structure. The embodiment removes the first material from a portion of the first layer that is exposed from removing the selectively removable material up to the height of the first step. The embodiment removes a remainder of the selectively removable material to expose a second portion of the first layer, the second portion of the first layer forming the first step. The embodiment deposits a second layer of a second material on the first structure, the second structure, and the second portion of the first layer, the depositing the second layer causing a formation of a stepped structure at the surface of the first structure, the stepped structure reducing a tendency of the first structure to bend towards the second structure. Thus, the embodiment enables reduces or prevents bending of gates and other parallel structures.

In another embodiment, the second portion of the first layer is located at a first portion of the first structure where the first structure has the tendency to bend towards the second structure. Thus, the embodiment positions the step at a location where the bending tendency is more likely than another location.

Another embodiment further forms a second step at a second portion of the first structure where the first structure also has the tendency to bend towards the second structure. Thus, any number of steps can be formed to strengthen any length or height of a parallel structure.

In another embodiment, the second portion of the first structure is situated adjacent to the first portion of the first in the at least one direction. Thus, the embodiment causes the formation of adjacent steps for progressively strengthening a contiguous length or height of a parallel structure.

In another embodiment, removing the selectively removable material up to the height of the first step removes the selectively removable material from the first layer up to the height. Thus, the embodiment specifically removes the material such that a base of the first step is formed at a desired location.

Another embodiment further fills, as a part of depositing the selectively removable material, an available space between the first layer covering the first structure and the first layer covering the second structure, with the selectively removable material. Thus, the embodiment causes the first step to be formed between the two parallel structures that have a tendency to bend towards each other.

Another embodiment further fills, as a part of depositing the selectively removable material, the selectively removable material at least above the height of the first step. Thus, the embodiment enables removal of the selectively removable material such that at least the desired height will remain.

In another embodiment, the selectively removable material comprises an organic planarization material. Thus, the embodiment enables the use of a known material for the selective removal process.

In another embodiment, the first layer comprises a spacer layer. Thus, the embodiment enables the use of a known material for forming the step.

In another embodiment, the first material comprises a dielectric material. Thus, the embodiment enables the use of a known material for forming the step.

In another embodiment, the surface of the first structure is disposed substantially parallelly to the surface of the second structure in the at least one direction by having a variation of a non-zero distance between the first structure and the surface of the second structure remain within a specified range of distances. Thus, the embodiment enables a reduction in a bending tendency in non-parallel but adjacent structures.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
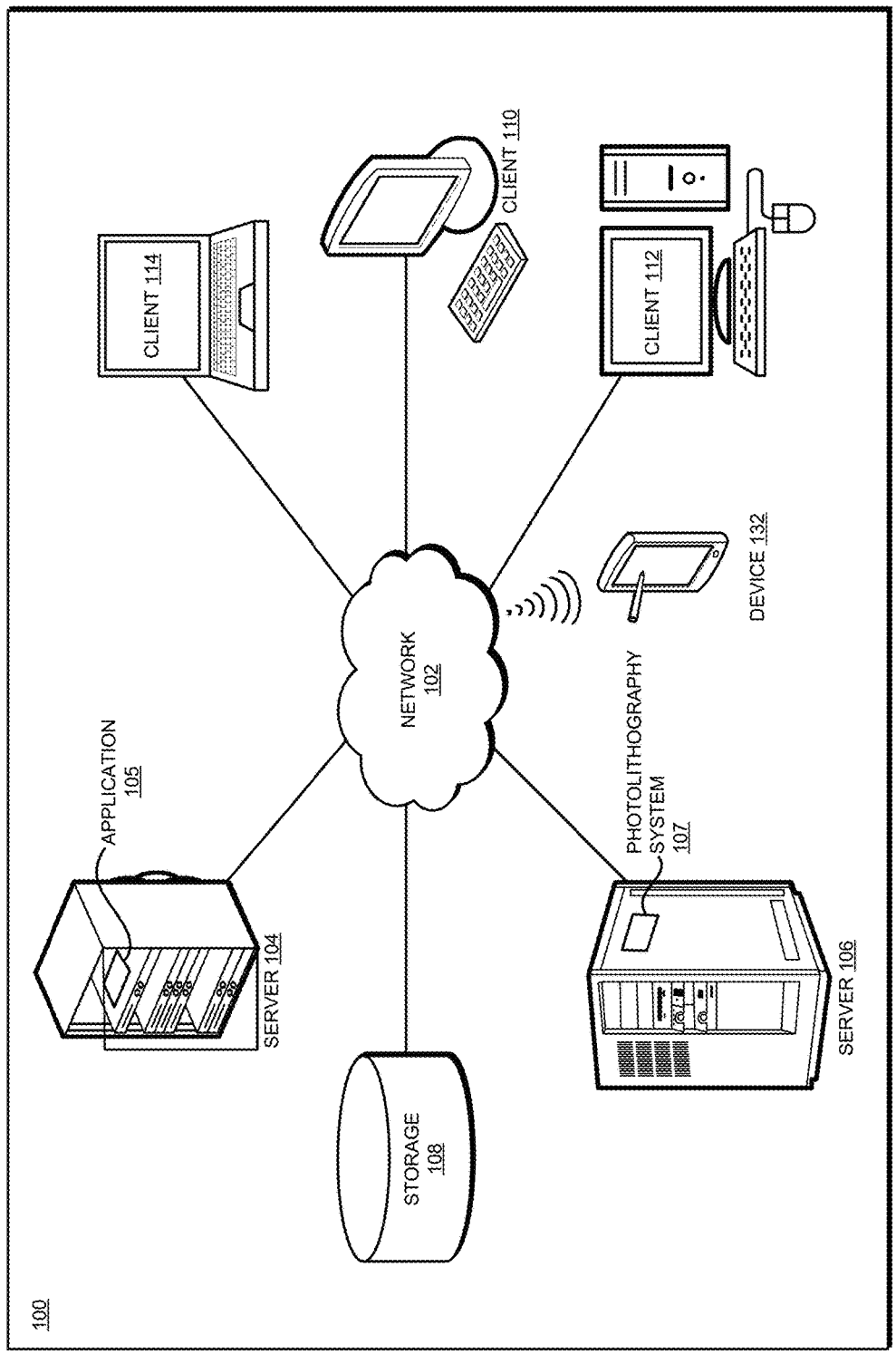
FIG. 1 depicts a block diagram of a network of data processing systems in which illustrative embodiments may be implemented.

The illustrative embodiments used to describe the invention generally address and solve the above-described problems and other problems related to reducing bending in parallel structures in semiconductor fabrication.

An embodiment can be implemented as a software application. The application implementing an embodiment can be configured as a modification of an existing semiconductor fabrication system—such as a photolithography system, as a separate application that operates in conjunction with an existing semiconductor fabrication system, a standalone application, or some combination thereof. For example, the application can be configured to cause the semiconductor fabrication system to perform the steps described herein, to fabricate a finFET in which the parallel gates have a reduced tendency to bend towards each other, as described herein.

The illustrative embodiments provide a fabrication method for parallel structures in semiconductor devices that reduces a bending tendency in a structure that is parallel to an adjacent structure. The structure can be the same or different from the adjacent structure, but is disposed parallelly relative to at least one side of the adjacent structure in at least one direction, and can be oriented in any direction—such as vertically or horizontally.

While the illustrative embodiments are described using parallel gate structures in a finFET, the illustrative embodiments are not intended to be limited to the fabrication of such gates. An embodiment can be adapted for reducing a bending tendency in other structures in a similar manner, and such adaptations are contemplated within the scope of the illustrative embodiments.

Furthermore, only for the clarity of the description, and without implying any limitation thereto, the illustrative embodiments are described with respect to fabricating a stepped spacer structure on or around the gates of a finFET. A stepped structure is a structure that resembles one or more stair-steps of same or different widths. An embodiment can be adapted to fabricate other stepped layers, other stepped structures, for purposes other than or in addition to the reduction of bending tendencies in other planar and non-planar devices in a similar manner. For example, a stepped structure formed using an embodiment can also be used to progressively increase or decrease an impedance between two structures, progressively taper a structure, or generally to form steps like structures in one or more directions for any suitable purpose.

Furthermore, a simplified diagram of the example parallel gate structures is used in the figures and the illustrative embodiments. In an actual fabrication of parallel gate structures, additional structures that are not shown or described herein, or structures different from those shown and described herein, may be present without departing the scope of the illustrative embodiments. Similarly, within the scope of the illustrative embodiments, a shown or described structure in the example finFET may be fabricated differently to yield a similar operation or result as described herein.

Differently shaded portions in the two-dimensional drawings of the example finFET are intended to represent different structures in the example finFET, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating a finFET according to the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in reducing bending in parallel structures in semiconductor fabrication. A manner of fabrication to reduce a bending tendency in parallel structures or even non-parallel adjacent structures is unavailable in the presently available methods. Thus, a substantial advancement of such devices or data processing systems by executing a method of an embodiment is in an improved fabrication of structures where a bending tendency in adjacent structures is reduced.

The illustrative embodiments are described with respect to certain types of devices, electrical properties, contacts, orientations, directions, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
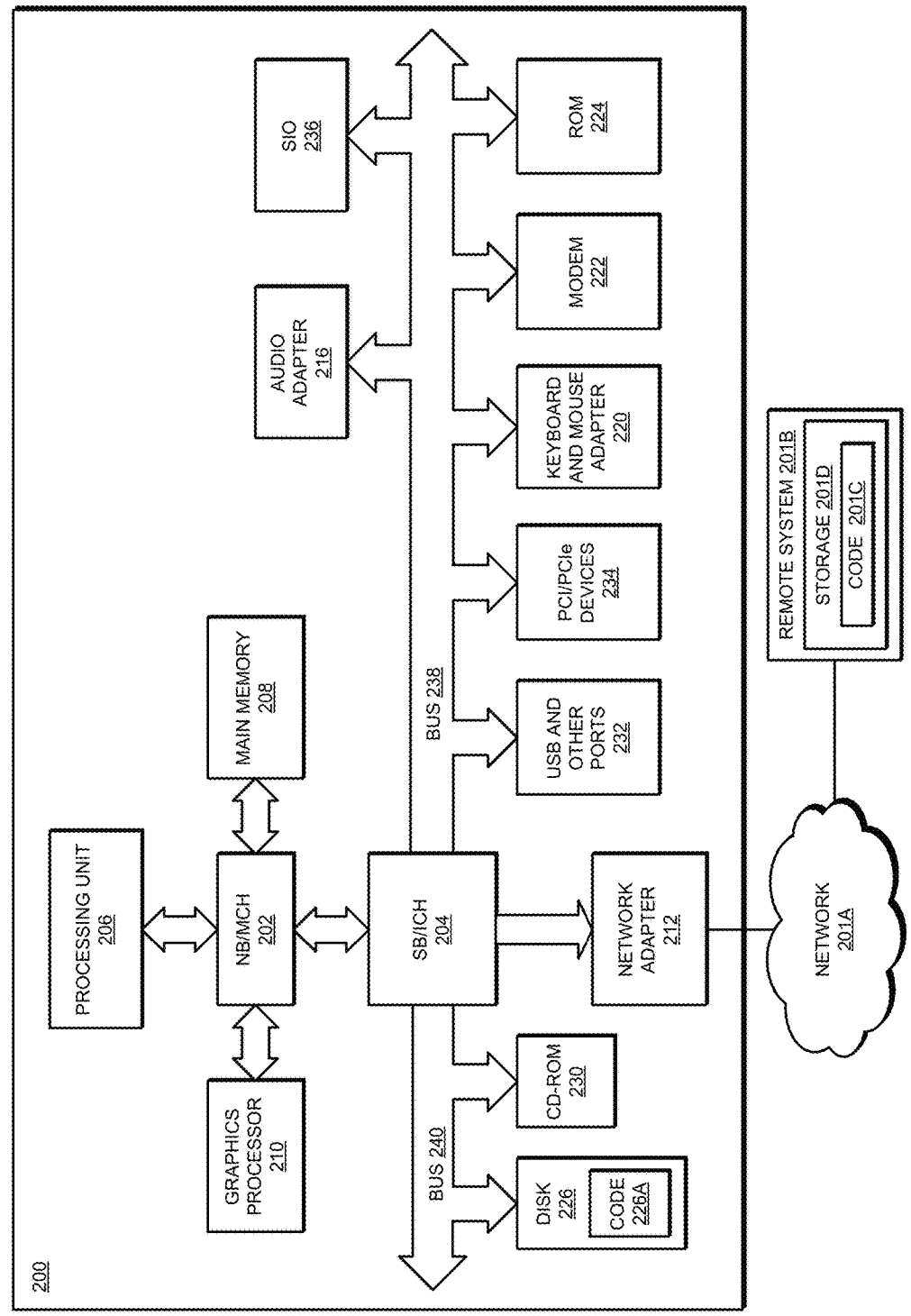
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a data processing device or a portable device usable for computing or communications purposes described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating a device, component, or structure, in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other data processing devices, such as mobile device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. In another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different computer-components or data processing devices attached to the fabric or architecture.

A communications unit may include one or more communications-capable devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3A:
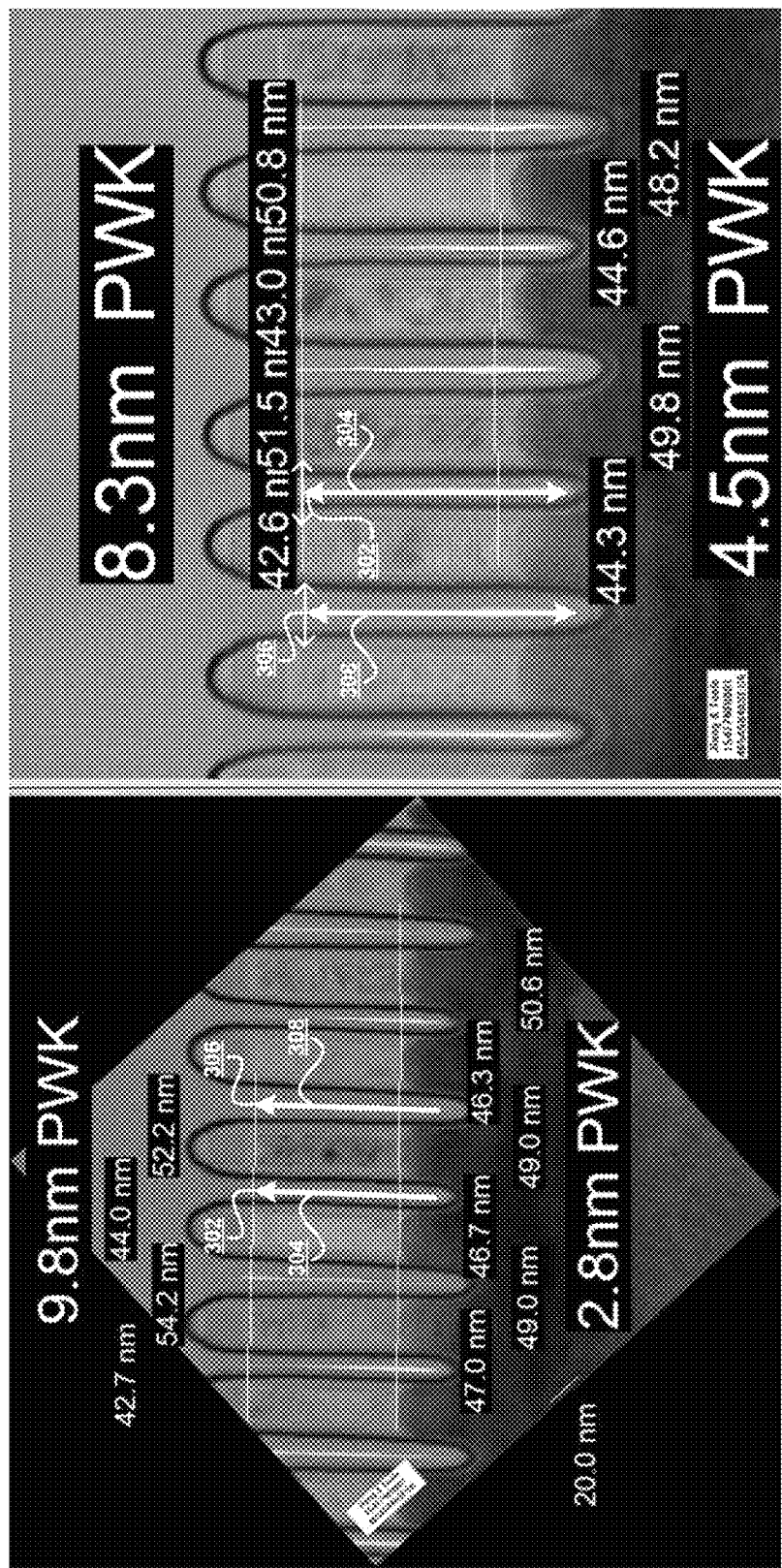
FIG. 3A depicts a microscopic image of gap width and length change caused by gate bending, which can be avoided or reduced by using an illustrative embodiment.

With reference to FIG. 3A, this figure depicts a microscopic image of gap width and length change caused by gate bending, which can be avoided or reduced by using an illustrative embodiment. As can be seen, gap width 302 is uneven from the bottom to the top—wider at the bottom and narrower at the top, effecting gap length 304 of the gap. Comparing gap width 302 with gap width 306, it is evident that gap width 306 is also uneven, but narrower at the bottom and wider at the top, causing gap length 308 to be significantly more than gap length 304.

Figure 3B:
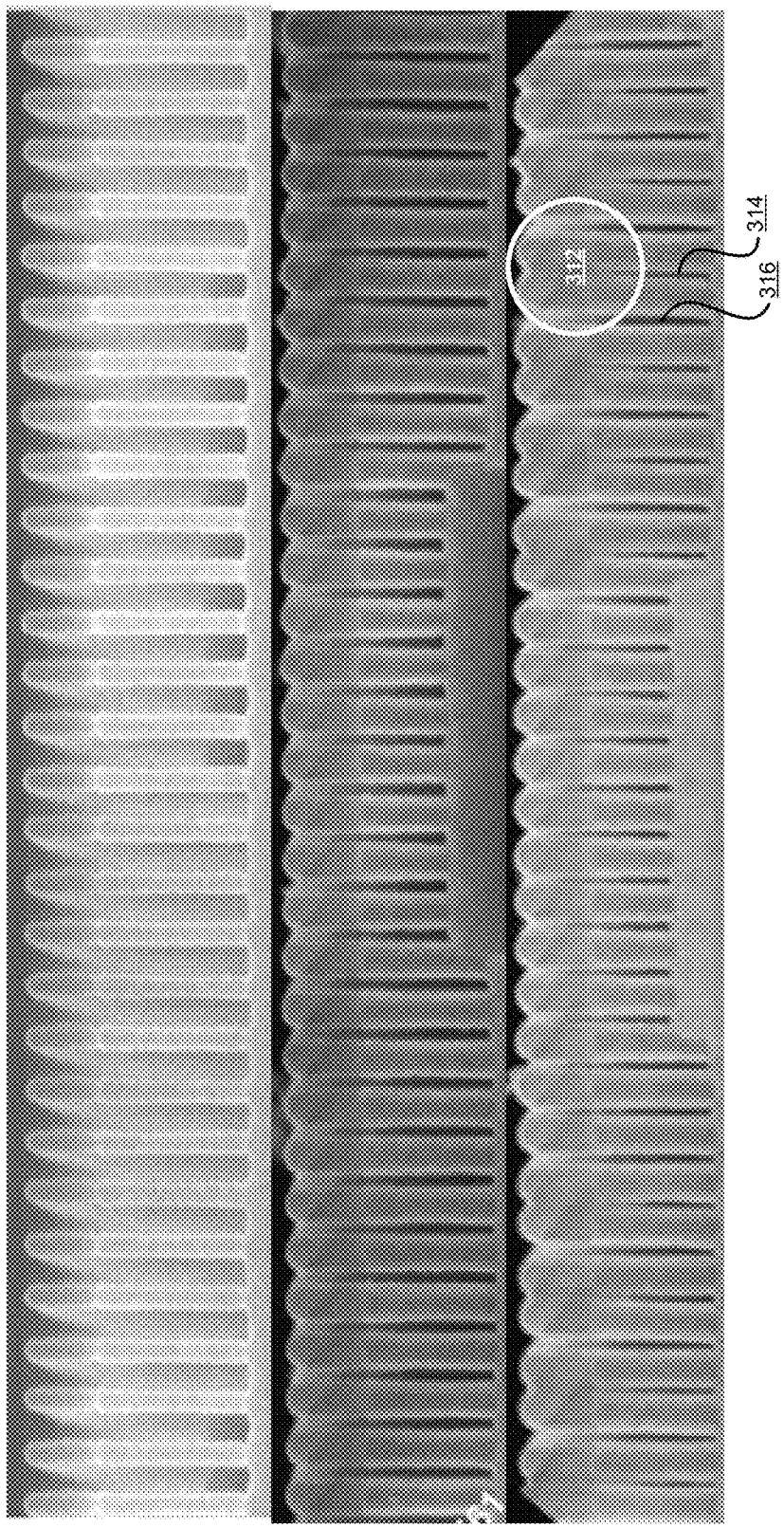
FIG. 3B depicts another microscopic image of gap width and length change caused by gate bending, which can be avoided or reduced by using an illustrative embodiment.

With reference to FIG. 3B, this figure depicts another microscopic image of gap width and length change caused by gate bending, which can be avoided or reduced by using an illustrative embodiment. As can be seen, in pair 312, two parallel structures have bent towards each other (or one structure in the pair has bent towards the other in the pair). Gap 314 exhibits a width that is tapering from the bottom (proximal) end to the top (distal) end due to the bending. Gap 316 also exhibits an uneven width which is tapering from the top (distal) end to the bottom (proximal) end. This type of bending, gap width variations, gap height variation, or some combination thereof, are undesirable.

Figure 4:
FIG. 4 depicts a block diagram of an example step in reducing bending in parallel structures in semiconductor fabrication in accordance with an illustrative embodiment.

With reference to FIG. 4, this figure depicts a block diagram of an example step in reducing bending in parallel structures in semiconductor fabrication in accordance with an illustrative embodiment. Example fin 402 and example parallel gates 404, 406, and 408 are fabricated as shown. Three gates are shown only as an example. An embodiment can be implemented using only two structures that are adjacent to each other, e.g., gates 404 and 406. Layers 410 and 412 are hard mask (HM) layers placed on gates 404, 406, and 406, as shown.

Only as non-limiting examples, gates 404 and 406 are formed using amorphous Silicon (a-Si), HM layer 410 is formed using a suitable oxide, such as Silicon Oxide (SiO2), HM layer 412 is formed using a suitable nitride, such as Silicon Nitride (SiN). Other suitable materials can be used to form gates 404-406 or other parallel or adjacent structures, one or more HM layers in the manner of layers 410 and/or 412.

Figure 5:
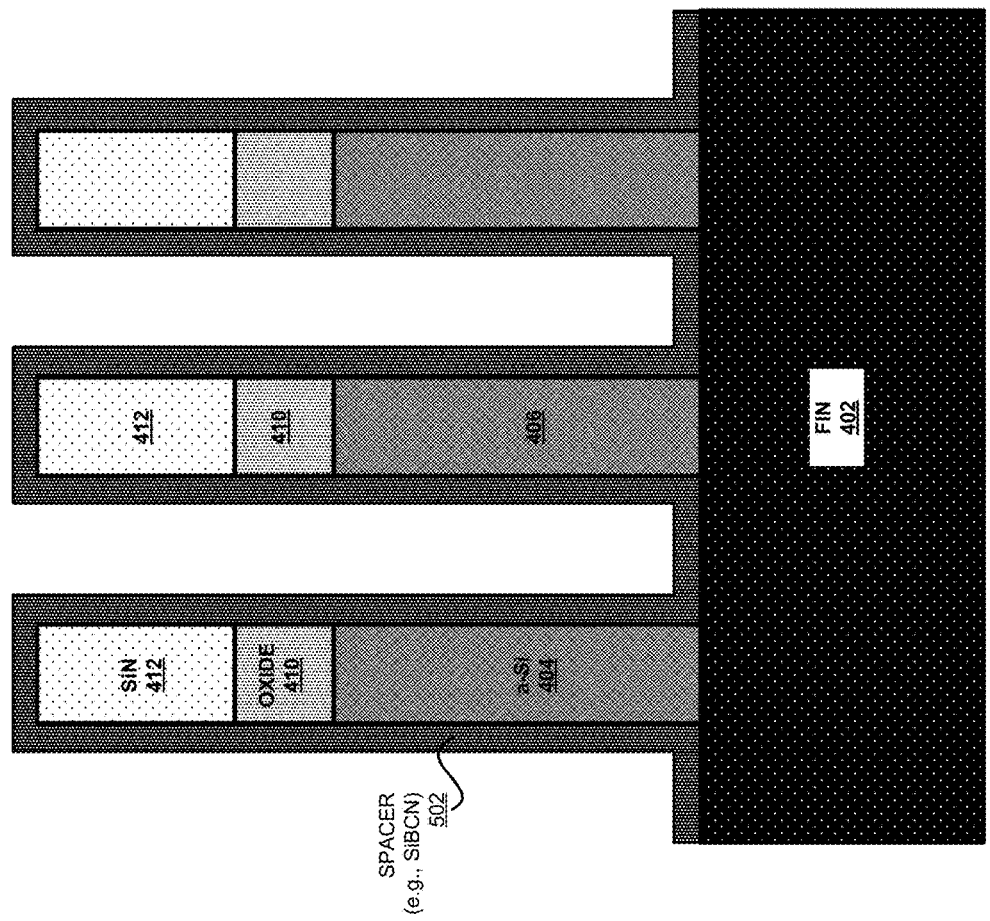
FIG. 5 depicts a block diagram of another example step in reducing bending in parallel structures in semiconductor fabrication in accordance with an illustrative embodiment.
Figure 8:
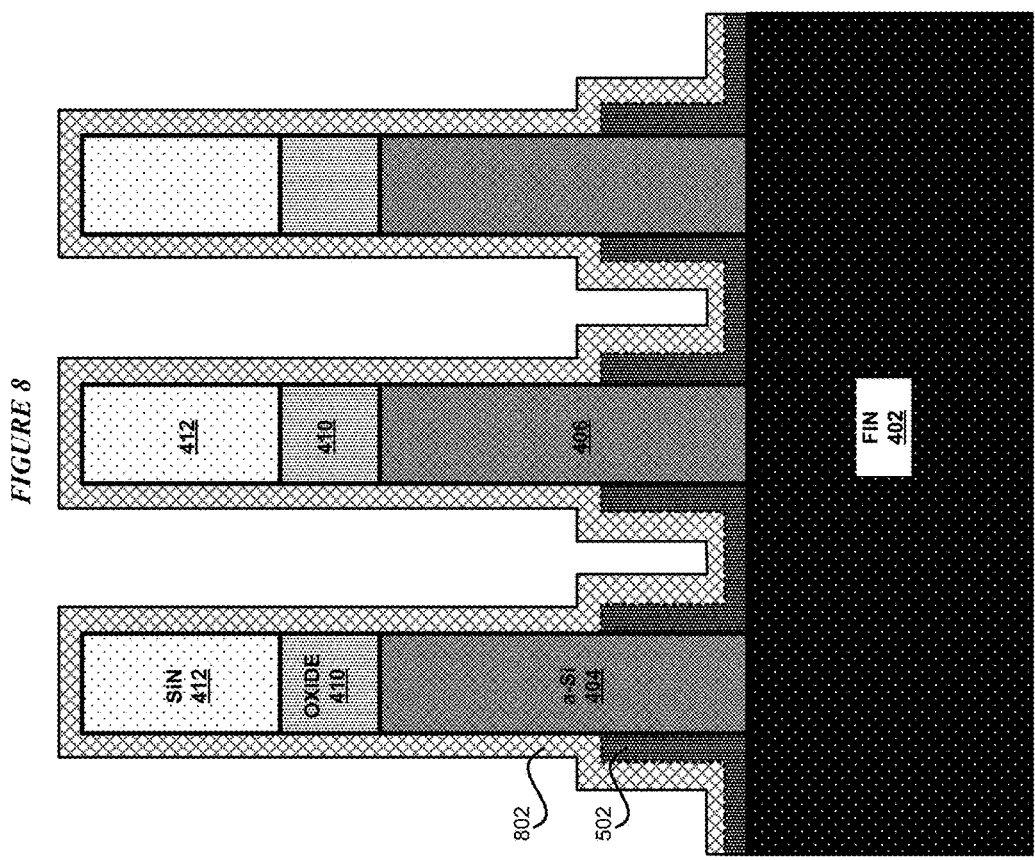
FIG. 8 depicts a block diagram of another example step in reducing bending in parallel structures in semiconductor fabrication in accordance with an illustrative embodiment.

With reference to FIG. 5, this figure depicts a block diagram of another example step in reducing bending in parallel structures in semiconductor fabrication in accordance with an illustrative embodiment. Example spacer 502 is deposited over certain surfaces of fin 402 and parallel gates 404 and 406 as shown. The thickness of spacer 502 is determined by the narrowest step in the stepped structure that is eventually formed, as shown in FIGS. 8 et seq., on or around gates 404-406. For example, a structure that will have a single step, the thickness of spacer 502 can be approximately half of the final thickness of the widest step.

Only as a non-limiting example, spacer 502 is formed using siliconBoroCarboNitride (SiBCN). Other suitable materials, such as SiO2, SiN, SiliconOxyCarboNitride (SiOCN) can be used to form spacer 502 or other similar structures.

Figure 6:
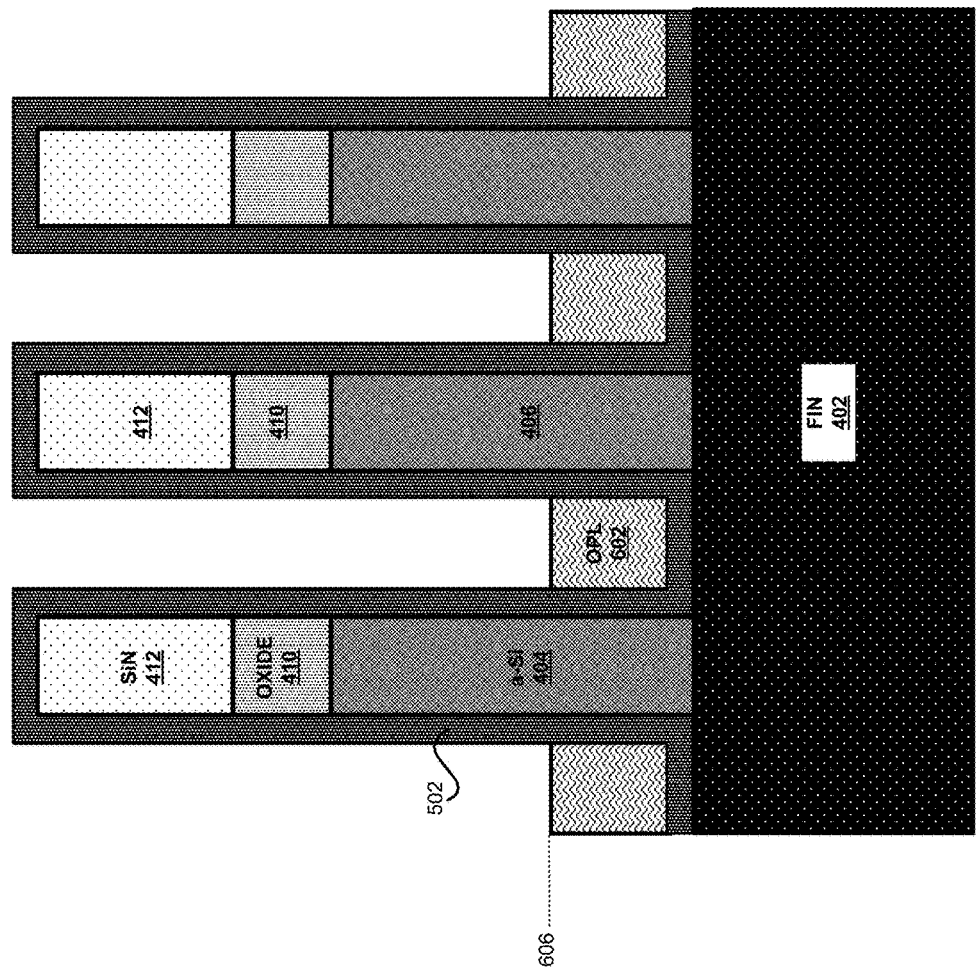
FIG. 6 depicts a block diagram of another example step in reducing bending in parallel structures in semiconductor fabrication in accordance with an illustrative embodiment.

With reference to FIG. 6, this figure depicts a block diagram of another example step in reducing bending in parallel structures in semiconductor fabrication in accordance with an illustrative embodiment. Example Organic Planarization Layer (OPL) 602 is deposited between gates 404 and 406, up to level 604, and etched or removed up to level 606 as shown.

The OPL material of layer 602 is a selectively removable material. I.e., the OPL material can be specifically targeted for removal in such a way that the materials of fin 402, gates 404-406, or spacer 502 remains unaffected by the removal of the OPL material. The Organic planarization material is only a non-limiting example. Any selectively removable material that is suitable in a particular fabrication implementation can be used as layer 602 within the scope of the illustrative embodiments. Different materials may be suitable depending upon a method of planarization, a direction of planarization, and other considerations.

Furthermore, level 604 can be, but need not be, up to or above the top of spacer 502 as shown. As an example, level 604 can be approximately 100 nm above gates 404-406. Generally, level 604 can be any level higher than level 606, such that selective removal of the removable material can be controlled down to level 606.

Only as a non-limiting example, spacer 502 is formed using siliconBoroCarboNitride (SiBCN). Other suitable materials, such as SiO2, SiN, SiliconOxyCarboNitride (SiOCN) can be used to form spacer 502 or other similar structures.

Figure 7:
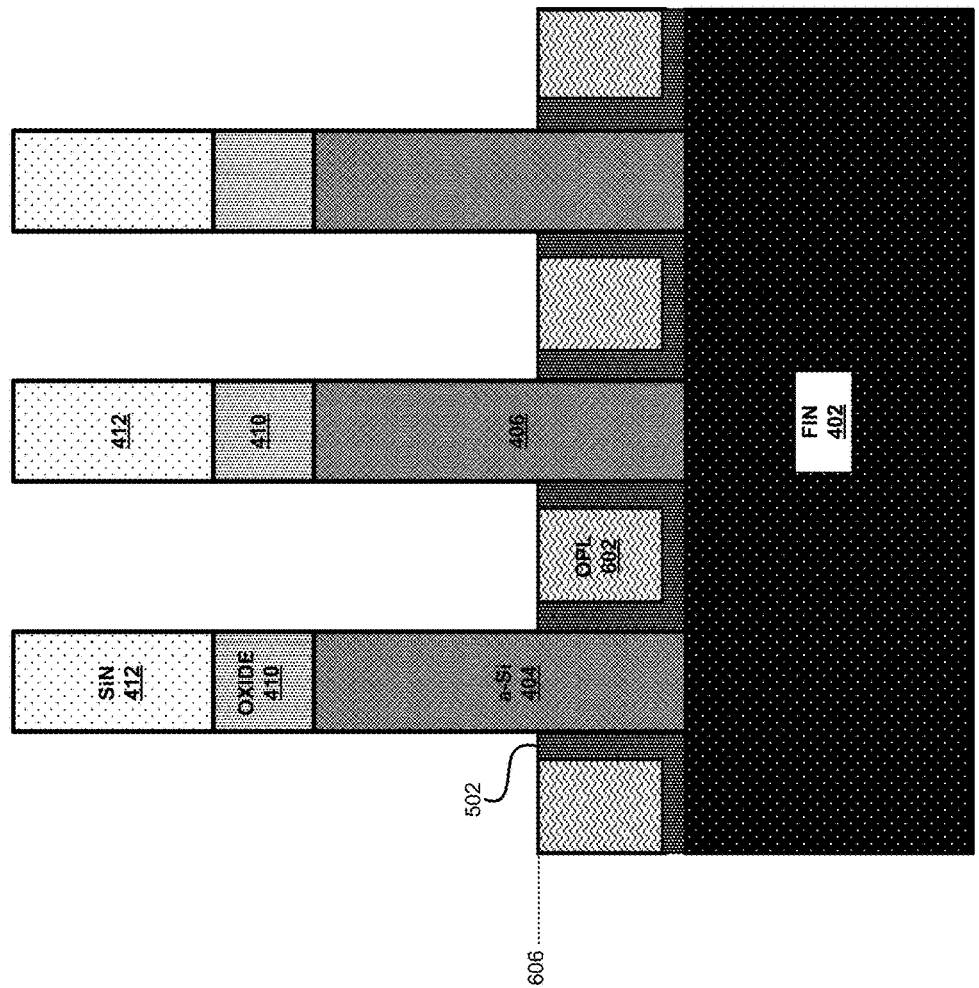
FIG. 7 depicts a block diagram of another example step in reducing bending in parallel structures in semiconductor fabrication in accordance with an illustrative embodiment.

With reference to FIG. 7, this figure depicts a block diagram of another example step in reducing bending in parallel structures in semiconductor fabrication in accordance with an illustrative embodiment. Spacer 502 is etched or removed from gates 404 and 406 up to the level of the remaining OPL layer 602, i.e., up to level 606 as shown. That spacer material remains on or around gates 404-406 which is at or below OPL layer 602.

With reference to FIG. 8, this figure depicts a block diagram of another example step in reducing bending in parallel structures in semiconductor fabrication in accordance with an illustrative embodiment. The partial removal of spacer 502 in FIG. 7 exposes the structure under spacer 502 where the spacer material has been removed, to wit, portions of gates 404-406 and their HM layers 410-412. The remaining OPL layer is also removed to expose the remaining portion of spacer 502 on or around other portions of gates 404-406.

Another layer—layer 802—is deposited over the structure exposed by the partial removal of the spacer material, and over the remaining spacer layer 502, as shown in FIG. 8. This manner of forming layer 802 over the remnants of layer 502 creates a stepped structure about the proximal end of gates 404-406, where the bending is otherwise observed.

The material, height, and thickness of layer 802 can be selected based on the specific fabrication implementation. In one example implementation, layer 802 is formed of the same material and approximate thickness as layer 502.

Figure 9:
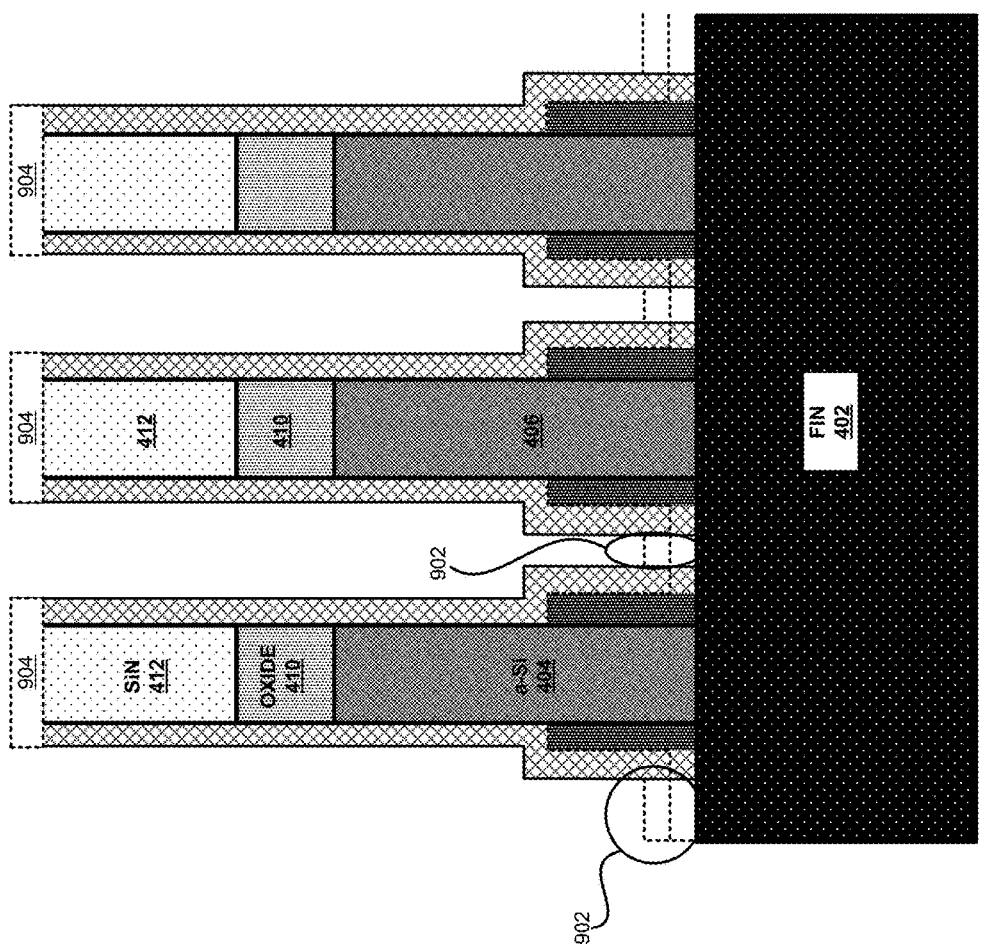
FIG. 9 depicts a block diagram of another optional example step in reducing bending in parallel structures in semiconductor fabrication in accordance with an illustrative embodiment.

With reference to FIG. 9, this figure depicts a block diagram of another optional example step in reducing bending in parallel structures in semiconductor fabrication in accordance with an illustrative embodiment. The step depicted in this figure constitutes an additional step to fabricate a specific example device—the finFET. This step can be omitted or changed depending on the type of device being fabricated.

In this example step, portions 902 of the stepped structure, which was formed in FIG. 8, is etched or removed. The removal of portion 902 of the stepped structure exposes portions of fin 402, e.g., between parallel gates 404-406 at the proximal ends of gates 404-406 where gates 404-406 connect with fin 402. Notice that the mechanical strength provided by the stepped structure around the proximal ends of adjacent gates 404-406 is still intact for resisting and reducing the bending tendency of gates 404-406. If needed, as in this example case, portions 904 of layer 802 can also be removed at this step.

Figure 10:
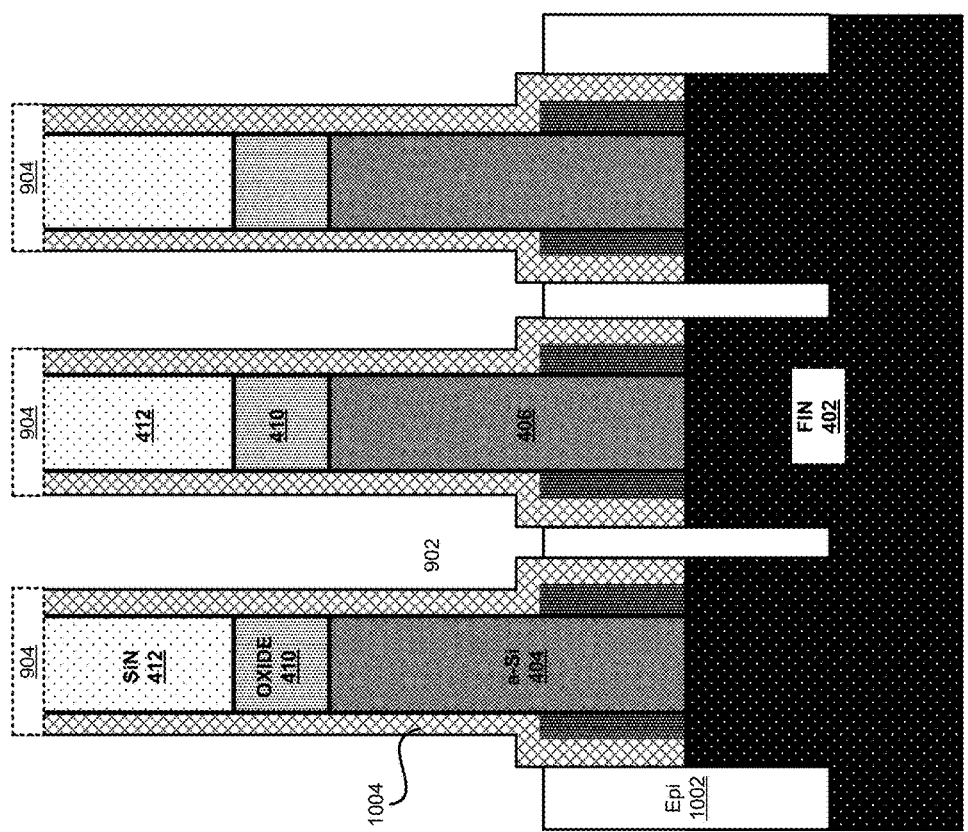
FIG. 10 depicts a block diagram of another optional example step in reducing bending in parallel structures in semiconductor fabrication in accordance with an illustrative embodiment.

With reference to FIG. 10, this figure depicts a block diagram of another optional example step in reducing bending in parallel structures in semiconductor fabrication in accordance with an illustrative embodiment. The step depicted in this figure constitutes an additional step to fabricate a specific example device—the finFET. This step can be omitted or changed depending on the type of device being fabricated.

In this example step, other structures are placed in portions 902. For example, in the case of a finFET device, epitaxy (also referred to as "epi") structures 1002 are grown into fin 402 as shown. An additional advantage of the stepped structure obtained in FIGS. 8 and 9, i.e., structure 1004, also shields gates 404-406 from the epi growth process, and prevents the growth of epi 1002 into the amorphous Silicon of gates 404-406.

Figure 11:
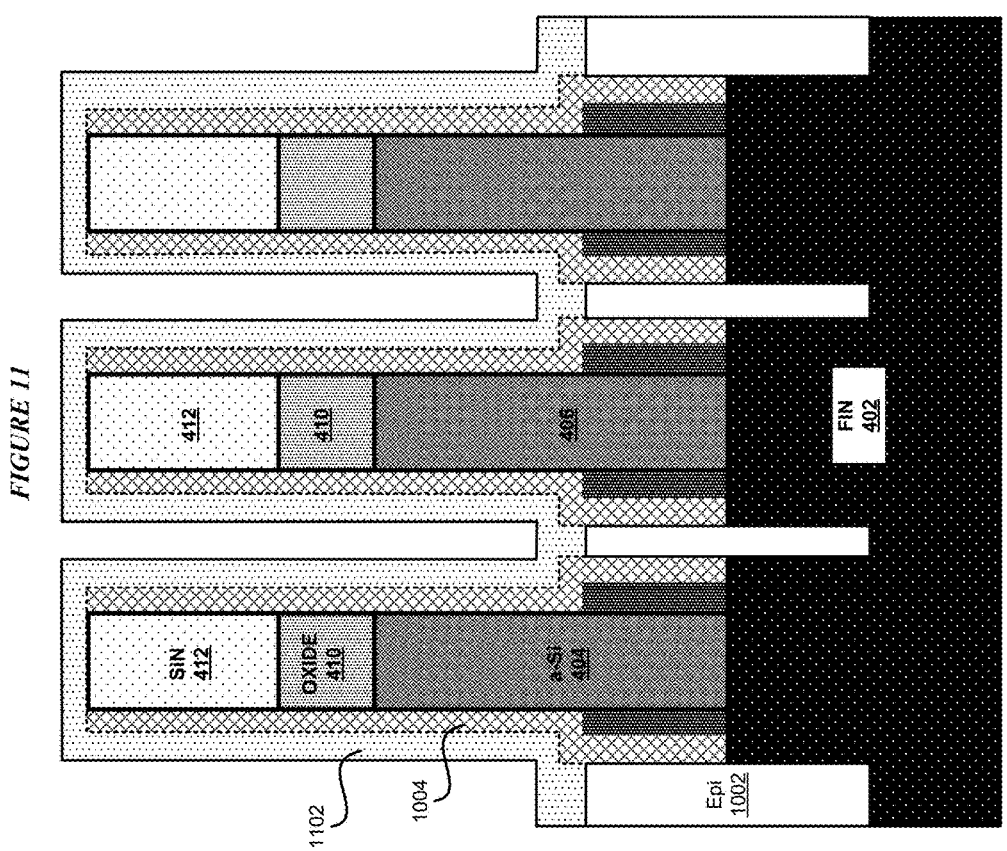
FIG. 11 depicts a block diagram of another optional example step in reducing bending in parallel structures in semiconductor fabrication in accordance with an illustrative embodiment.

With reference to FIG. 11, this figure depicts a block diagram of another optional example step in reducing bending in parallel structures in semiconductor fabrication in accordance with an illustrative embodiment. The step depicted in this figure constitutes an additional step to fabricate a specific example device—the finFET. This step can be omitted or changed depending on the type of device being fabricated.

In this example step, other structures are placed over structure 1002 and stepped structure 1004. For example, in the depicted example case, layer 1102 of a suitable liner material, e.g., SiBCN, is deposited over structure 1002 and stepped structure 1004. Structure 1102 serves in this example to increase the top thickness of the overall gate structure comprising gate 404, HM layers 410 and 412, and stepped structure 1004.

Figure 12:
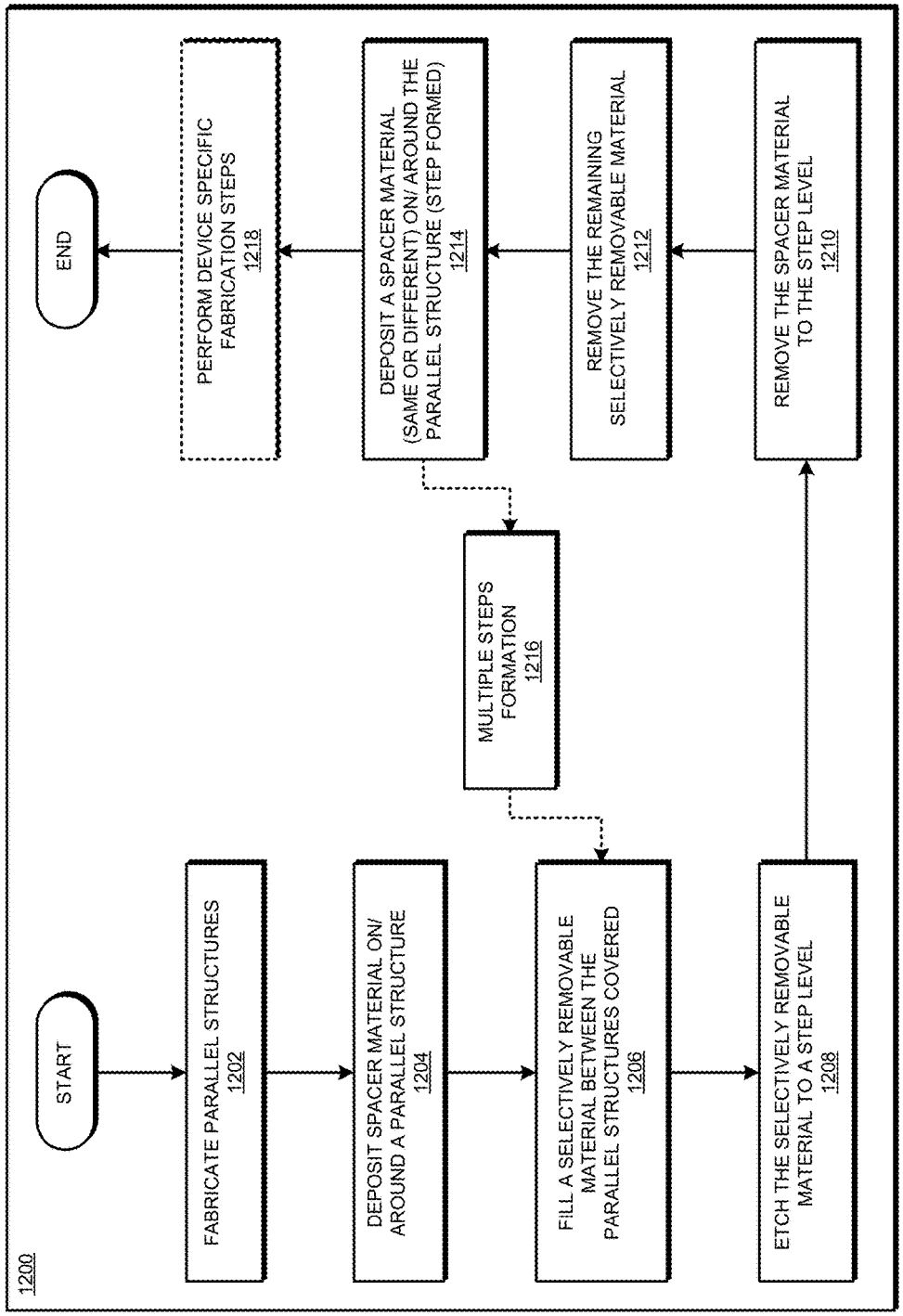
FIG. 12 depicts a flowchart of an example process for reducing bending in parallel structures in semiconductor fabrication in accordance with an illustrative embodiment.

With reference to FIG. 12, this figure depicts a flowchart of an example process for reducing bending in parallel structures in semiconductor fabrication in accordance with an illustrative embodiment. Process 1200 can be implemented in application 105 in FIG. 1.

The application fabricates a pair of parallel structures or adjacent structures as described herein (block 1202). The application deposits a first layer of material, such as but not limited to a spacer material, on or around the parallel structures to substantially cover the parallel structures (block 1204).

The application fills a selectively removable material between the covered parallel structures (block 1206). The application etches or removes the selectively removable material up to a desired step level (block 1208).

The application removes the spacer material, which is exposed by the removal of the selectively removable material, up to the step level (block 1210). The application removes the remaining selectively removable material (block 1212). The removal of block 1212 exposes a portion of remaining first layer around the proximal end of parallel structures.

The application deposits a second layer of material on or around the parallel structures and the exposed portion of the remaining first layer, to substantially cover the parallel structures (block 1204). The material of the second layer may be, but is not limited to the material of the first layer.

Depositing the second layer, with a portion of the first layer remaining under the second layer causes the formation of a stepped structure around the parallel structures. The stepped structure around the parallel structures is wider at that portion of the parallel structures where the tendency to bend would otherwise be observed. Thus, the stepped structure reduces the bending tendency of the parallel structures.

Each iteration through blocks 1206-1214 forms one step in the stepped structure. If multiple steps are to be formed (block 1216), the application returns to block 1206 and repeats blocks 1206-1214 to form additional steps, where each step is at a different height and is of a different thickness.

The application may end process 1200 thereafter, or proceed to performing device-specific steps. For example, for the fabrication of a specific device, e.g., the finFET depicted in FIGS. 9-11, the application performs finFET-specific fabrication steps (block 1218). For example, the application may cause a portion of the fin of the finFET to be exposed through etching parts of the first and the second layers, growing epi in one or more such exposed portions, and depositing a liner over the structures assembled thus far. Any device-specific steps can be performed at block 1218 without being limited to these example steps or the depictions of FIGS. 9-11. The application ends process 1200 thereafter.

Thus, a computer implemented method, system or apparatus, and computer program product are provided in the illustrative embodiments for reducing bending in parallel structures in semiconductor fabrication and other related features, functions, or operations. Where an embodiment or a portion thereof is described with respect to a type of mobile device, the computer implemented method, system or apparatus, the computer program product, or a portion thereof, are adapted or configured for use with a suitable and comparable manifestation of that type of mobile device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
    depositing, on a first structure and a second structure, a first layer of a first material, a surface of the first structure being disposed substantially parallelly to a surface of the second structure in at least one direction;
    depositing a selectively removable material over the first layer;
    removing the selectively removable material up to a height of a first step from the surface of the first structure and the surface of the second structure;
    removing the first material from a portion of the first layer that is exposed from removing the selectively removable material up to the height of the first step;
    removing a remainder of the selectively removable material to expose a second portion of the first layer, the second portion of the first layer forming the first step; and
    depositing a second layer of a second material on the first structure, the second structure, and the second portion of the first layer, the depositing the second layer causing a formation of a stepped structure at the surface of the first structure, the stepped structure reducing a tendency of the first structure to bend towards the second structure.

2. The method of claim 1, wherein the second portion of the first layer is located at a first portion of the first structure where the first structure has the tendency to bend towards the second structure.

3. The method of claim 2, further comprising:
  forming a second step at a second portion of the first structure where the first structure also has the tendency to bend towards the second structure.

4. The method of claim 3, wherein the second portion of the first structure is situated adjacent to the first portion of the first in the at least one direction.

5. The method of claim 1, wherein removing the selectively removable material up to the height of the first step removes the selectively removable material from the first layer up to the height.

6. The method of claim 1, further comprising:
  filling, as a part of depositing the selectively removable material, an available space between the first layer covering the first structure and the first layer covering the second structure, with the selectively removable material.

7. The method of claim 1, further comprising:
  filling, as a part of depositing the selectively removable material, the selectively removable material at least above the height of the first step.

8. The method of claim 1, wherein the selectively removable material comprises an organic planarization material.

9. The method of claim 1, wherein the first layer comprises a spacer layer.

10. The method of claim 1, wherein the first material comprises a dielectric material.

11. The method of claim 1, wherein the surface of the first structure is disposed substantially parallelly to the surface of the second structure in the at least one direction by having a variation of a non-zero distance between the first structure and the surface of the second structure remain within a specified range of distances.

12. A computer usable program product comprising one or more computer-readable storage devices, and program instructions stored on at least one of the one or more storage devices, the stored program instructions comprising:
  program instructions to deposit, on a first structure and a second structure, a first layer of a first material, a surface of the first structure being disposed substantially parallelly to a surface of the second structure in at least one direction;
  program instructions to deposit a selectively removable material over the first layer;
  program instructions to remove the selectively removable material up to a height of a first step from the surface of the first structure and the surface of the second structure;
  program instructions to remove the first material from a portion of the first layer that is exposed from removing the selectively removable material up to the height of the first step;
  program instructions to remove a remainder of the selectively removable material to expose a second portion of the first layer, the second portion of the first layer forming the first step; and
  program instructions to deposit a second layer of a second material on the first structure, the second structure, and the second portion of the first layer, the depositing the second layer causing a formation of a stepped structure at the surface of the first structure, the stepped structure reducing a tendency of the first structure to bend towards the second structure.

13. The computer usable program product of claim 12, wherein the second portion of the first layer is located at a first portion of the first structure where the first structure has the tendency to bend towards the second structure.

14. The computer usable program product of claim 13, further comprising:
  program instructions to form a second step at a second portion of the first structure where the first structure also has the tendency to bend towards the second structure.

15. The computer usable program product of claim 14, wherein the second portion of the first structure is situated adjacent to the first portion of the first in the at least one direction.

16. The computer usable program product of claim 12, wherein removing the selectively removable material up to the height of the first step removes the selectively removable material from the first layer up to the height.

17. The computer usable program product of claim 12, further comprising:
  program instructions to fill, as a part of depositing the selectively removable material, an available space between the first layer covering the first structure and the first layer covering the second structure, with the selectively removable material.

18. The computer usable program product of claim 12, wherein the computer usable code is stored in a computer readable storage device in a data processing system, and wherein the computer usable code is transferred over a network from a remote data processing system.

19. The computer usable program product of claim 12, wherein the computer usable code is stored in a computer readable storage device in a server data processing system, and wherein the computer usable code is downloaded over a network to a remote data processing system for use in a computer readable storage device associated with the remote data processing system.

20. A computer system comprising one or more processors, one or more computer-readable memories, and one or more computer-readable storage devices, and program instructions stored on at least one of the one or more storage devices for execution by at least one of the one or more processors via at least one of the one or more memories, the stored program instructions comprising:
  program instructions to deposit, on a first structure and a second structure, a first layer of a first material, a surface of the first structure being disposed substantially parallelly to a surface of the second structure in at least one direction;
  program instructions to deposit a selectively removable material over the first layer;
  program instructions to remove the selectively removable material up to a height of a first step from the surface of the first structure and the surface of the second structure;
  program instructions to remove the first material from a portion of the first layer that is exposed from removing the selectively removable material up to the height of the first step;
  program instructions to remove a remainder of the selectively removable material to expose a second portion of the first layer, the second portion of the first layer forming the first step; and
  program instructions to deposit a second layer of a second material on the first structure, the second structure, and the second portion of the first layer, the depositing the second layer causing a formation of a stepped structure at the surface of the first structure, the stepped structure reducing a tendency of the first structure to bend towards the second structure.

* * * * *